US012635482B2

(12) United States Patent
Kim et al.

(10) Patent No.: US 12,635,482 B2
(45) Date of Patent: May 19, 2026

(54) METHOD OF FORMING A PATTERN OF SEMICONDUCTOR DEVICE OF A SEMICONDUCTOR DEVICE ON A SEMICONDUCTOR SUBSTRATE BY USING AN EXTREME ULTRAVIOLET MASK

(71) Applicant: SAMSUNG ELECTRONICS CO., LTD., Suwon-si (KR)

(72) Inventors: Kisung Kim, Seoul (KR); Sangoh Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 902 days.

(21) Appl. No.: 17/956,919

(22) Filed: Sep. 30, 2022

(65) Prior Publication Data

US 2023/0106148 A1 Apr. 6, 2023

(30) Foreign Application Priority Data

Oct. 5, 2021 (KR) ........................ 10-2021-0131964

(51) Int. Cl.
*H01L 21/027* (2006.01)
*G03F 7/00* (2006.01)
*H01L 21/311* (2006.01)

(52) U.S. Cl.
CPC ...... *H01L 21/0275* (2013.01); *G03F 7/70441* (2013.01); *H01L 21/31144* (2013.01)

(58) Field of Classification Search
CPC ............. H01L 21/0275; H01L 21/0274; H01L 21/32139; G03F 7/70441; G03F 7/70466; H10B 12/09
See application file for complete search history.

(56) References Cited

U.S. PATENT DOCUMENTS 5,698,347 A 12/1997 Bae
6,576,914 B2 6/2003 Brunner
(Continued)

FOREIGN PATENT DOCUMENTS

KR 10-0190762 A 1/1999
KR 10-2014-0094352 A 7/2014
(Continued)

OTHER PUBLICATIONS

First Office Action issued in corresponding application No. TW Patent Application No. 111137839 on Jan. 19, 2024.
(Continued)

*Primary Examiner* — Bac H Au
(74) *Attorney, Agent, or Firm* — Morgan, Lewis & Bockius LLP

(57) ABSTRACT
A method of forming a pattern of a semiconductor device includes: preparing a semiconductor substrate including a cell region and an outer region; applying a photoresist on the semiconductor substrate; irradiating extreme ultraviolet (EUV) light reflected from an EUV mask, onto the photoresist; forming a photoresist pattern in the cell region and the outer region; and etching the semiconductor substrate, using the photoresist pattern as an etch mask. The EUV mask includes: a plurality of main patterns in a first zone, of the EUV mask, corresponding to the cell region; and a first lane and a second lane in a second zone, of the EUV mask, corresponding to the outer region, wherein the first lane and the second lane surround the plurality of main patterns, wherein the first lane has a line-and-space pattern, and the second lane has a protruding pattern.

20 Claims, 12 Drawing Sheets

AA

(56)  References Cited

U.S. PATENT DOCUMENTS

| | | | |
|---|---|---|---|
| 7,463,333 | B2 | 12/2008 | Park et al. |
| 9,627,202 | B2 | 4/2017 | Ha et al. |
| 9,721,808 | B2 | 8/2017 | Kang et al. |
| 9,779,941 | B2 | 10/2017 | Park |
| 10,163,641 | B2 | 12/2018 | Lee et al. |
| 10,816,894 | B2 * | 10/2020 | Li ............................. G03F 1/70 |
| 11,411,010 | B2 | 8/2022 | Seong et al. |
| 11,474,426 | B2 | 10/2022 | Ha et al. |
| 2012/0171865 | A1 | 7/2012 | Yoo |
| 2012/0237860 | A1 * | 9/2012 | Kim ....................... B82Y 10/00 |
| | | | 430/5 |
| 2014/0113220 | A1 * | 4/2014 | Chu .......................... G03F 1/72 |
| | | | 355/72 |
| 2019/0189458 | A1 * | 6/2019 | Li ....................... H01L 21/3086 |
| 2020/0073225 | A1 * | 3/2020 | Shih .......................... G03F 1/38 |
| 2021/0057350 | A1 * | 2/2021 | Lu ....................... H01L 21/3083 |

FOREIGN PATENT DOCUMENTS

| | | | |
|---|---|---|---|
| KR | 10-2020-0031923 | A | 3/2020 |
| KR | 10-2021-0032843 | A | 3/2021 |

OTHER PUBLICATIONS

Singh et al., "Hexagonal Hole Array Patterning for Memory Applications", Journal of Photopolymer Science and Technology, vol. 28, No. 5, The Society of Photopolymer Science and Technology (SPST), 2015, pp. 623 to 629.
Office Action of Korean Patent Office in Application No. 10-2021-0131964, dated Jul. 9, 2025.

* cited by examiner

1000

1300
100
1430
1400
1100
1200
1410
EUV LIGHT SOURCE
ILLUMINATION OPTICAL SYSTEM
200
1500

Z
Y
X

1100

1140    1150    1130
1120
1123
1141
1131
1110
OL
EL
LASER LIGHT SOURCE
1121
1160

METHOD OF FORMING A PATTERN OF SEMICONDUCTOR DEVICE OF A SEMICONDUCTOR DEVICE ON A SEMICONDUCTOR SUBSTRATE BY USING AN EXTREME ULTRAVIOLET MASK

CROSS-REFERENCE TO RELATED APPLICATION

This application claims priority under 35 U.S.C. § 119 to Korean Patent Application No. 10-2021-0131964, filed on Oct. 5, 2021, in the Korean Intellectual Property Office, the disclosure of which is incorporated by reference herein in its entirety.

TECHNICAL FIELD

The present inventive concept relates to a method of forming a pattern of a semiconductor device, and more particularly, to a method of forming a pattern of a semiconductor device on a semiconductor substrate by using an extreme ultraviolet (EUV) mask.

DISCUSSION OF THE RELATED ART

Generally, a photolithography technique including exposure and development processes are used to form semiconductor devices on semiconductor substrates. Recently, in forming a fine photoresist pattern on the semiconductor substrate according to the tendency of down-scaling of semiconductor devices, extreme ultraviolet (EUV) light may be used as the light source of an exposure apparatus. In general, an EUV mask used in such an EUV exposure apparatus so that an overlapping exposure is performed, and a fine photoresist pattern is formed on the semiconductor substrate as a result of the overlapping exposure. To form the overlapping exposure, various methods have been under development to design accurate mask patterns in the EUV mask.

SUMMARY

According to an exemplary embodiment of the present inventive concept, a method of forming a pattern of a semiconductor device includes: preparing a semiconductor substrate on which a cell region and an outer region surrounding the cell region are provided; applying a photoresist on the semiconductor substrate; irradiating extreme ultraviolet (EUV) light reflected from an EUV mask, onto the photoresist; forming a photoresist pattern in the cell region and the outer region by developing the photoresist; and etching the semiconductor substrate, using the photoresist pattern as an etch mask. The EUV mask includes: a plurality of main patterns arranged in a first zone, of the EUV mask, corresponding to the cell region, in a first direction and in a second direction substantially perpendicular to the first direction; and a first lane and a second lane in a second zone, of the EUV mask, corresponding to the outer region, wherein the first lane and the second lane surround the plurality of main patterns, wherein the first lane extends in the first direction and has a line-and-space pattern, and the second lane extends in the second direction and has a protruding pattern.

According to an exemplary embodiment of the present inventive concept, a method of forming a pattern of a semiconductor device includes: shifting an extreme ultraviolet (EUV) mask in different directions from a center point of a semiconductor substrate, and overlapping and irradiating EUV light reflected from the EUV mask, onto a photoresist on the semiconductor substrate; and developing the photoresist to form a photoresist pattern having a plurality of circle patterns and a closed square dam pattern, wherein the circle patterns are arranged in a honeycomb structure, and wherein the closed square dam pattern surrounds the plurality of circle patterns. A mask pattern, of the EUV mask, corresponding to the dam pattern includes: a first lane extending in a first direction and having a line-and-space pattern; and a second lane extending in a second direction substantially perpendicular to the first direction and having a protruding pattern.

According to an exemplary embodiment of the present inventive concept, a method of forming a pattern of a semiconductor device includes: overlapping and irradiating EUV light reflected from an EUV mask, onto a photoresist, wherein the EUV mask includes a plurality of main patterns, a first lane, and a second lane, wherein the plurality of main patterns arranged in a honeycomb shape, wherein the first lane surrounds the plurality of main patterns, extends in a first direction, and has a plurality of lines, and wherein the second lane extends in a second direction substantially perpendicular to the first direction and has a protruding pattern.

BRIEF DESCRIPTION OF THE DRAWINGS

The above and other aspects of the present inventive concept will become more apparent by describing in detail embodiments thereof, with reference to the accompanying drawings, in which:

FIG. 6 is a plan view illustrating a part of a mask pattern and a part of a photoresist pattern corresponding thereto, according to an exemplary embodiment of the present inventive concept;

DETAILED DESCRIPTION OF THE EMBODIMENTS

Hereinafter, exemplary embodiments of the present inventive concept will be described in detail with reference to the accompanying drawings.

Figures 1A, 1B:
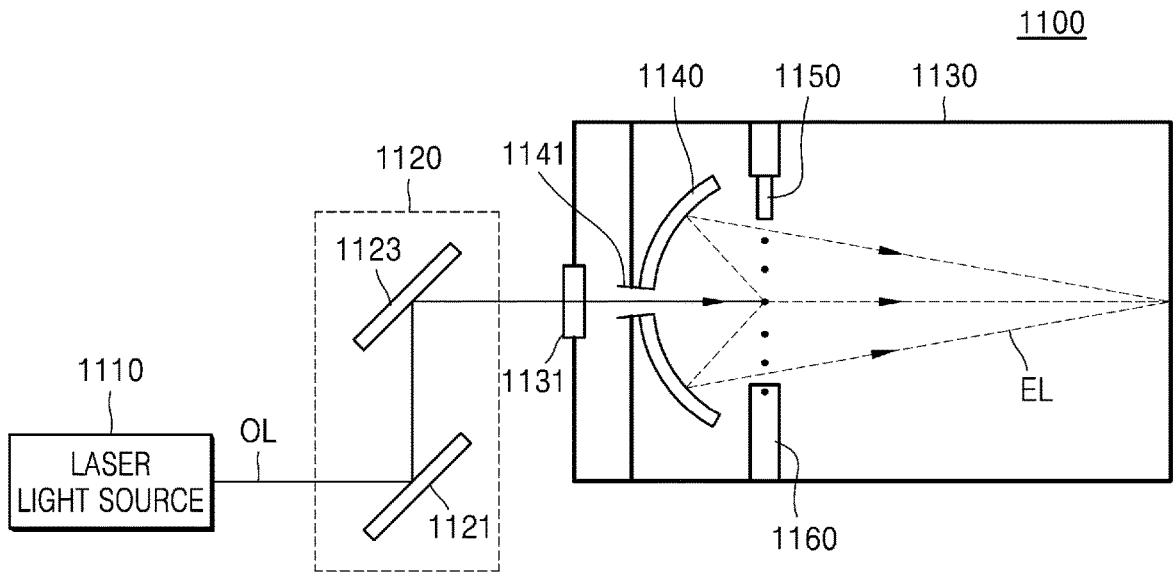
FIGS. 1A and 1B are schematic diagrams schematically illustrating an extreme ultraviolet (EUV) exposure apparatus according to an exemplary embodiment of the present inventive concept.

FIGS. 1A and 1B are diagrams schematically illustrating an extreme ultraviolet (EUV) exposure apparatus according to an exemplary embodiment of the present inventive concept.

Referring to FIGS. 1A and 1B together, an EUV exposure apparatus 1000 may include an EUV light source 1100, an illumination optical system 1200, a reticle support 1300, a projection optical system 1400, and a substrate stage 1500.

The EUV light source 1100 may generate and output EUV light EL having a high energy density. For example, the EUV light EL emitted from the EUV light source 1100 may have a wavelength of about 4 nm to 124 nm. In an exemplary embodiment of the present inventive concept, the EUV light EL may have a wavelength of about 4 nm to about 20 nm. For example, the EUV light EL may have a wavelength of about 13.5 nm.

The EUV light source 1100 may be a plasma-based light source or a synchrotron radiation light source. Here, the plasma-based light source refers to a light source of a method that generates plasma and uses light emitted by the plasma. In addition, the plasma-based light source includes a laser produced plasma light source or a discharge produced plasma light source.

The EUV light source 1100 may include a laser light source 1110, a transmission optical system 1120, a vacuum chamber 1130, collector mirror 1140, droplet generator 1150, and droplet catcher 1160.

The laser light source 1110 may be configured to output a laser OL. For example, the laser light source 1110 may output a carbon dioxide laser. The laser OL output from the laser light source 1110 may be reflected by the plurality of reflection mirrors 1121 and 1123, which are included in the transmission optical system 1120, to be incident on a window 1131 of the vacuum chamber 1130, and may be introduced into the vacuum chamber 1130.

An aperture 1141 through which the laser OL may pass is formed in the center of the collector mirror 1140, and the laser OL passes through the aperture 1141 of the collector mirror 1140 to be introduced into the vacuum chamber 1130.

The droplet generator 1150 may interact with the laser OL to generate droplets so that EUV light EL may be generated, and provide the droplets into the interior of the vacuum chamber 1130. The droplet may include at least one of, for example, tin (Sn), lithium (Li), and/or xenon (Xe). For example, the droplet may include at least one of tin (Sn), a tin compound (e.g., $SnBr_4$, $SnBr_2$, SnH), or a tin alloy (e.g., Sn—Ga, Sn—In, Sn—In—Ga).

The droplet catcher 1160 is located below the droplet generator 1150 and may be configured to catch the droplets that do not react with the laser OL. The droplets provided from the droplet generator 1150 may react with the laser OL that is introduced into the vacuum chamber 1130 to generate EUV light EL. The collector mirror 1140 may collect and reflect the EUV light EL, thereby emitting the EUV light EL to the illumination optical system 1200 arranged outside the vacuum chamber 1130.

The illumination optical system 1200 may include a plurality of reflective mirrors, and may transmit EUV light EL emitted from the EUV light source 1100 to the EUV mask 100. For example, EUV light EL emitted from the EUV light source 1100 may be reflected by a reflective mirror in the illumination optical system 1200, and the reflected EUV light EL may be incident on the EUV mask 100 arranged on the reticle support 1300.

The EUV mask 100 may be a reflective mask having a reflective region and a non-reflective (or intermediate reflective) region. For example, the EUV mask 100 may include a reflective multilayer film or single layer film and an absorption pattern. The reflective multilayer film or single layer film may be formed on a mask substrate formed of a material having a low coefficient of thermal expansion, such as silicon (Si) The absorption pattern may be formed on the reflective film, which may be a multilayer film or a single layer film. Here, the reflective multilayer film may correspond to the reflective region of the EUV mask 100, and the absorption pattern may correspond to the non-reflective (or intermediate reflective) region of the EUV mask 100.

The EUV mask 100 reflects the EUV light EL incident through the illumination optical system 1200 to be incident on the projection optical system 1400. For example, the EUV mask 100 structures the light incident from the illumination optical system 1200 into projection light based on a mask pattern formed by the reflective multilayer film and the absorption pattern on the mask substrate of the EUV mask 100, and makes the projection light incident on the projection optical system 1400. The projection light may be structured through at least two diffraction orders due to the EUV mask 100. Such projection light may be incident to the projection optical system 1400 while retaining information on the mask pattern of the EUV mask 100, and may pass through the projection optical system 1400 to form an image corresponding to the mask pattern of the EUV mask 100 on a semiconductor substrate 200. Details of the EUV mask 100 and the semiconductor substrate 200 according to an exemplary embodiment of the present inventive concept are described later.

The projection optical system 1400 may include a plurality of reflection mirrors 1410 and 1430. In FIG. 1, two reflection mirrors 1410 and 1430 are shown in the projection optical system 1400, but this is for convenience of description, and the projection optical system 1400 may include more reflection mirrors. For example, the projection optical system 1400 may generally include 4 to 8 reflection mirrors. However, the number of reflection mirrors included in the projection optical system 1400 is not limited to the above numerical values.

The semiconductor substrate 200 may be arranged on the substrate stage 1500. The substrate stage 1500 may move in X-axis and Y-axis directions on an X-Y plane, and may move in the Z direction perpendicular to the X-Y plane. The semiconductor substrate 200 may also move in the X, Y and Z directions by the movement of the substrate stage 1500.

Figure 2:
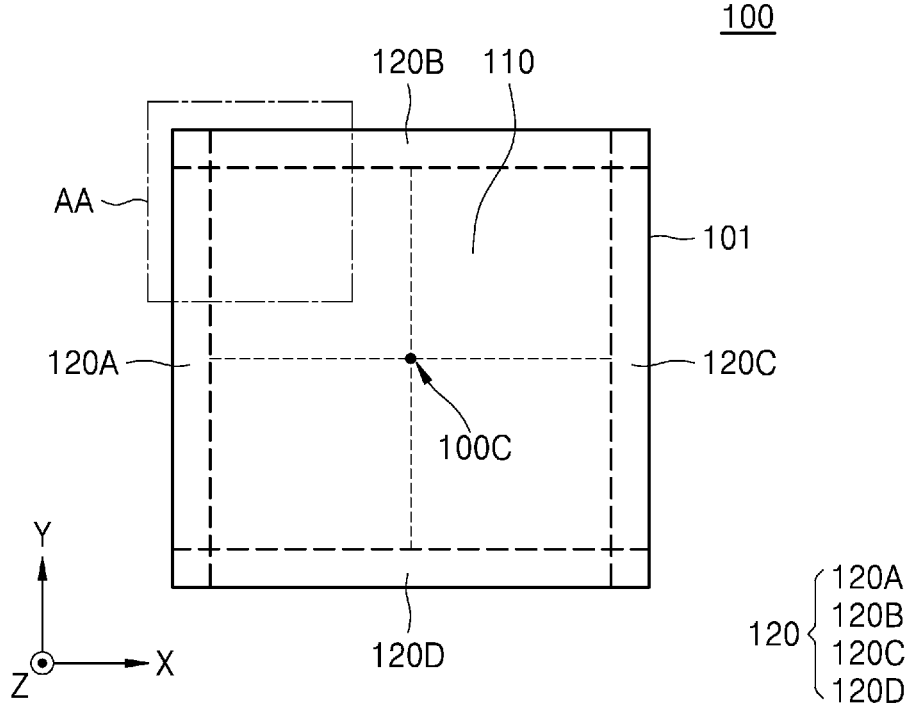
FIG. 2 is a plan view schematically illustrating an EUV mask according to an exemplary embodiment of the present inventive concept.
Figure 3:
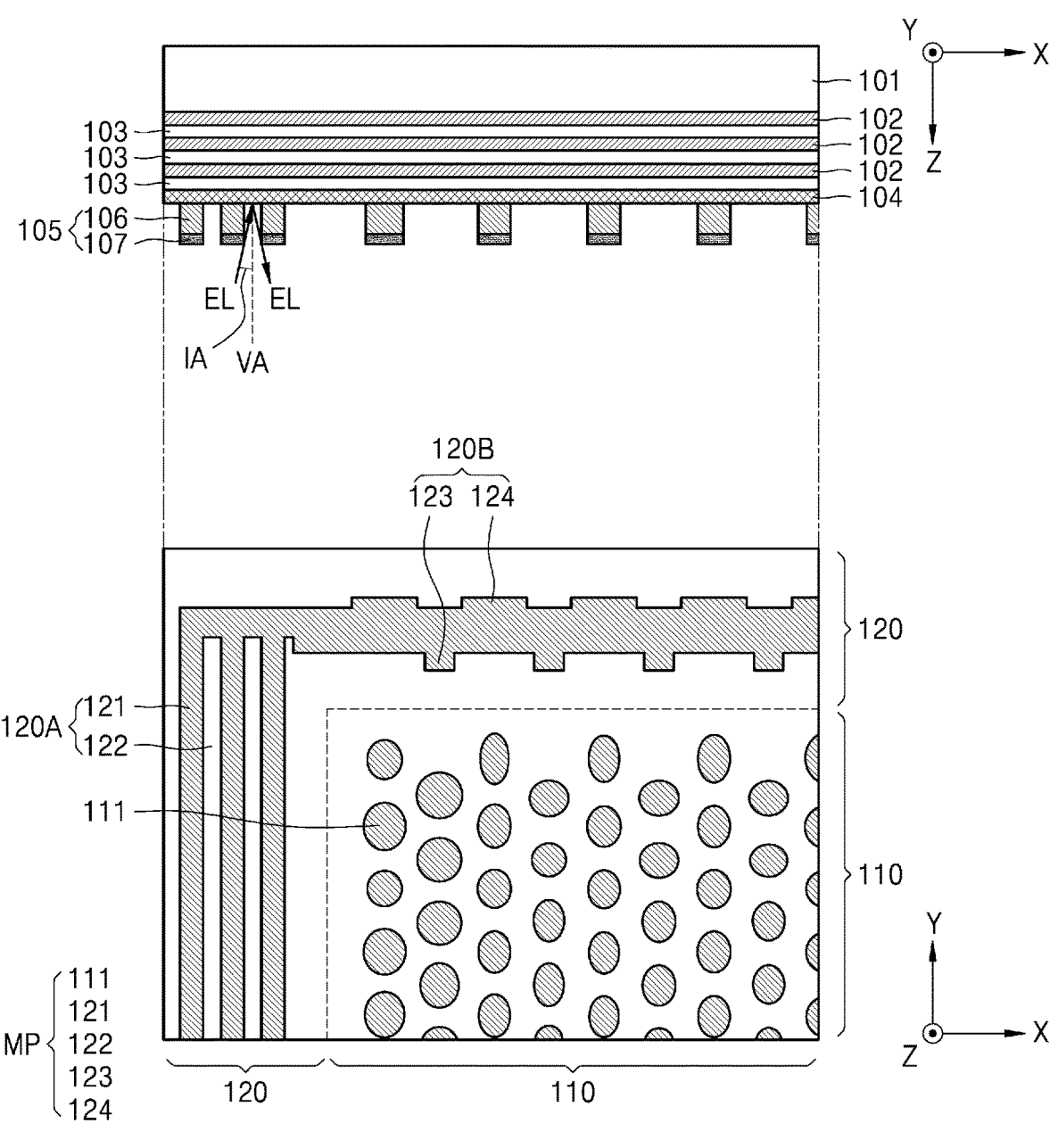
FIG. 3 shows cross-sectional and plan enlarged views illustrating an enlarged portion AA of FIG. 2.

FIG. 2 is a plan view schematically illustrating an EUV mask according to an exemplary embodiment of the present inventive concept, and FIG. 3 shows cross-sectional and plan enlarged views illustrating an enlarged portion AA of FIG. 2.

Referring to FIGS. 2 and 3 together, an EUV mask 100 may include a first zone 110 on a mask substrate 101 and a second zone 120 surrounding the first zone 110.

A mask substrate 101 may be formed of a material having a low coefficient of thermal expansion, such as silicon (Si). In addition, the mask substrate 101 may be made of, for example, quartz, glass, plastic, or the like. The EUV mask 100 may include reflective multilayer films 102, 103, and 104 and an absorption pattern 105. The reflective multilayer films 102, 103, and 104 may be formed on the mask substrate 101, and the absorption pattern 105 may be formed on the reflective multilayer films 102, 103, and 104.

The reflective multilayer films 102, 103, and 104 may be formed of a material that reflects EUV light EL. The reflective multilayer films 102, 103, and 104 may have, for example, a structure in which a silicon film 102 and a molybdenum film 103 are alternately stacked on each other. For example, a plurality of silicon films 102 and a plurality of molybdenum films 103 may be alternately stacked, and the thickness thereof may vary. In addition, a ruthenium layer 104 different from the silicon layer 102 and the molybdenum layer 103 may be arranged on the uppermost layer of the reflective multilayer layers 102, 103, and 104.

The absorption pattern 105 may be formed of a material that absorbs EUV light EL. The absorption pattern 105 may be formed of, for example, TaN, TaNO, TaBO, TaBN, Lr, or the like. In an exemplary embodiment of the present inventive concept, the absorption pattern 105 may have a multi-layer structure and may include a tantalum boron nitride layer 106 and a laurentium layer 107. However, the structure of the absorption pattern 105 is not limited thereto.

The EUV light EL is incident with an incident angle IA toward the EUV mask 100, and is reflected with a reflection angle with respect to a vertical axis VA perpendicular to the EUV mask 100. In an exemplary embodiment of the present inventive concept, the incident angle IA of the EUV light EL may be in a range of about 5° to about 7°, but the present inventive concept is not limited thereto.

The EUV mask 100 may include the first zone 110 and the second zone 120 surrounding the first zone 110. Mask patterns MP having different shapes may be formed in the first zone 110 and the second zone 120.

The first zone 110 may include a reticle center point 100C, and a main pattern 111 for patterning a cell region may be formed. The main pattern 111 formed on the mask substrate 101 may be a part of the absorption pattern 105 or may be configured as a complementary pattern of the absorption pattern 105.

In the first zone, a plurality of main patterns 111 may be arranged along the X and Y directions. For example, the plurality of main patterns 111 may be arranged in a honey-comb structure along the X and Y directions. Details of the honeycomb structure are described later.

The second zone 120 may include a first lane 120A and a third lane 120C respectively extending in the Y direction from two sides of the first zone 110 to pattern the outer region. For example, the first lane 120A and the third lane 120C may be opposite to each other. In addition, the second zone 120 may include a second lane 120B and a fourth lane 120D extending in an X direction perpendicular to the first lane 120A and the third lane 120C at the other sides of the first zone 110. For example, the second lane 120B and the fourth lane 120D may be opposite to each other. For example, the first lane 120A and the third lane 120C may intersect the second lane 120B and the fourth lane 120D.

In an exemplary embodiment of the present inventive concept, the first lane 120A and the second lane 120B may have mirror image symmetry with the third lane 120C and the fourth lane 120D, respectively, with respect to the first zone 110. In an exemplary embodiment of the present inventive concept, the first lane 120A and the second lane 120B may be the same as the third lane 120C and the fourth lane 120D, respectively.

The first lane 120A and the third lane 120C may have line-and-space patterns 121 and 122. Here, for example, the line-and-space patterns may include the line pattern 121, which may include at least two lines, and the space pattern 122, which may be positioned between the line patterns 121. In an exemplary embodiment of the present inventive concept, the line pattern 121 may be a straight line.

The second lane 120B and the fourth lane 120D may be line patterns having first and second protruding patterns 123 and 124. Here, the first protruding pattern 123 may be arranged in a direction (e.g., a −Y direction) approaching the plurality of main patterns 111, and the second protruding pattern 124 may be arranged in a direction (e.g., +Y direction) away from the plurality of main patterns 111 to form a concave portion and a convex portion.

Figure 4:
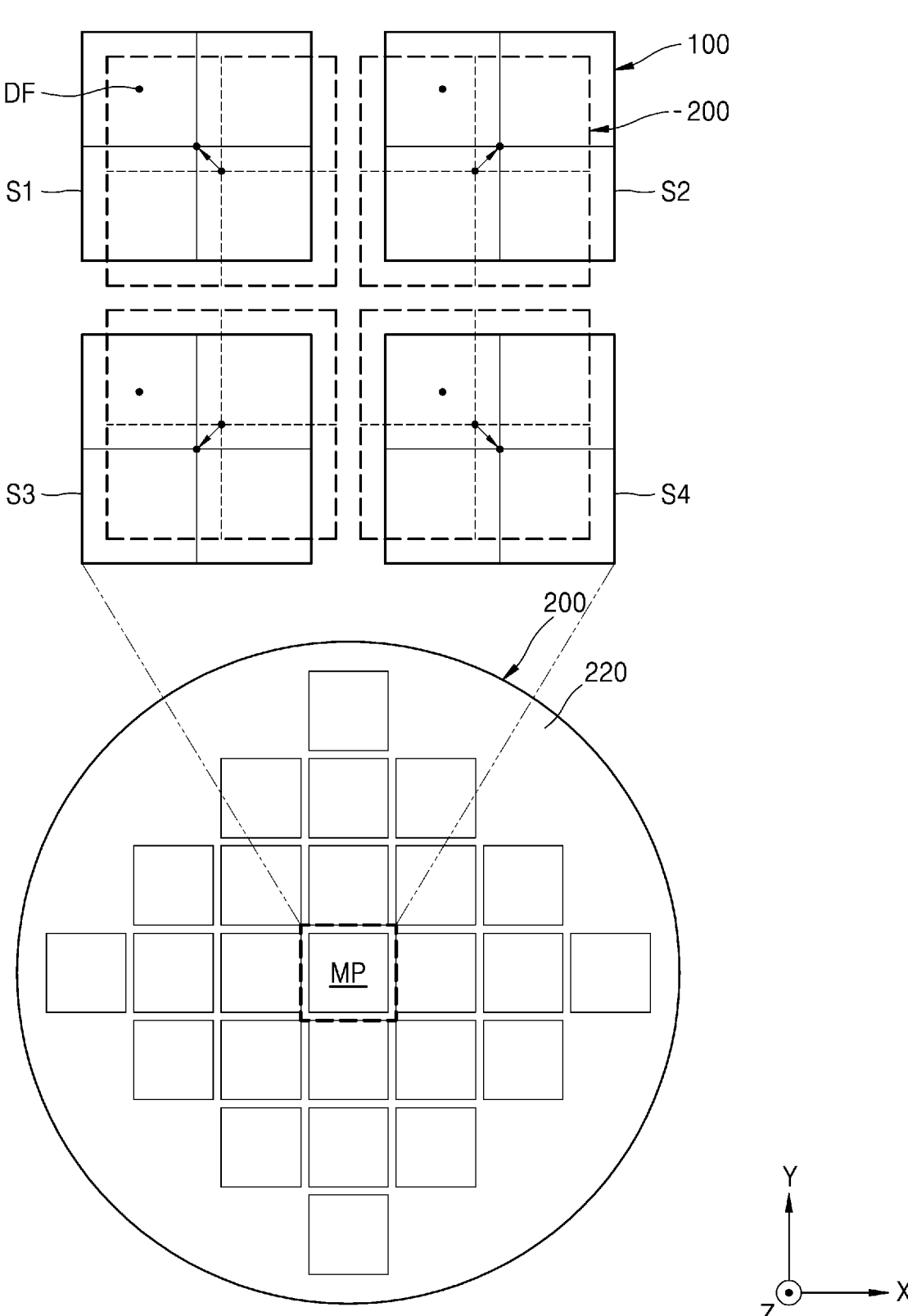
FIG. 4 is a conceptual diagram illustrating a method of exposing a mask pattern on a semiconductor substrate in a step and repeat method, by using an EUV mask according to an exemplary embodiment of the present inventive concept.

FIG. 4 is a conceptual diagram illustrating a method of exposing a mask pattern on a semiconductor substrate in a step and repeat manner, by using an EUV mask according to an exemplary embodiment of the present inventive concept.

Referring to FIG. 4, it shows that a mask pattern MP of an EUV mask 100 is exposed on a semiconductor substrate 200 by repeating at least two steps.

In an exemplary embodiment of the present inventive concept, EUV light reflected from the EUV mask 100 may overlap a photoresist 220 formed on the semiconductor substrate 200, and the photoresist 220 may be irradiated four times by the EUV light reflected from the EUV mask 100.

For example, a shot 1 S1 may be shifted in −X and +Y directions to irradiate the photoresist 220 formed on the semiconductor substrate 200 with about 25% of a total dose. A shot 2 S2 subsequent thereto may be shifted in +X and +Y directions to irradiate the photoresist 220 with about 25% of the total dose.

Subsequently, a shot 3 S3 may be shifted in −X and −Y directions to irradiate the photoresist 220 with about 25% of the total dose. A shot 4 S4 subsequent thereto may be shifted in +X and −Y directions to irradiate the photoresist 220 with about 25% of the total dose.

In this way, when exposure is performed by repeating steps 4 times, even if a defect DF exists in a portion of the EUV mask 100, the defect DF might not be transferred to the semiconductor substrate 200. Because the EUV mask 100 shifts in different directions while 4 steps are performed, the EUV light may be irradiated only once to different portions of the semiconductor substrate 200 corresponding to the defect DF. Accordingly, because the threshold light amount Th (refer to FIG. 5) might not be exceeded in the portion of the photoresist 220 corresponding to the defect DF, the defect DF might not be transferred to the photoresist 220 as a final pattern.

The photoresist 220 used in the EUV exposure apparatus 1000 (see FIG. 1A) is deposited at a temperature of about 80° C. to 150° C., and may be formed to a thickness of about 200 nm to about 600 nm, but the deposition temperature and formation thickness thereof are not limited to the above values.

In general, a chemically amplified photoresist material may be used as the photoresist 220 used for negative tone development. In addition, the exposed portion (for example, the portion irradiated with light equal to or greater than the threshold light amount) may remain, and the unexposed portion (for example, the portion not irradiated with light equal to or greater than the threshold light amount) may be removed by a solvent.

In an exemplary embodiment of the present inventive concept, the EUV mask 100 refers to a reticle used for exposing the photoresist 220 to pattern the photoresist 220, which is used for the negative tone development, into a desired mask pattern MP. However, the present inventive concept is not limited thereto, and a photoresist material used for positive tone development may be used as the photoresist 220.

Figure 5:
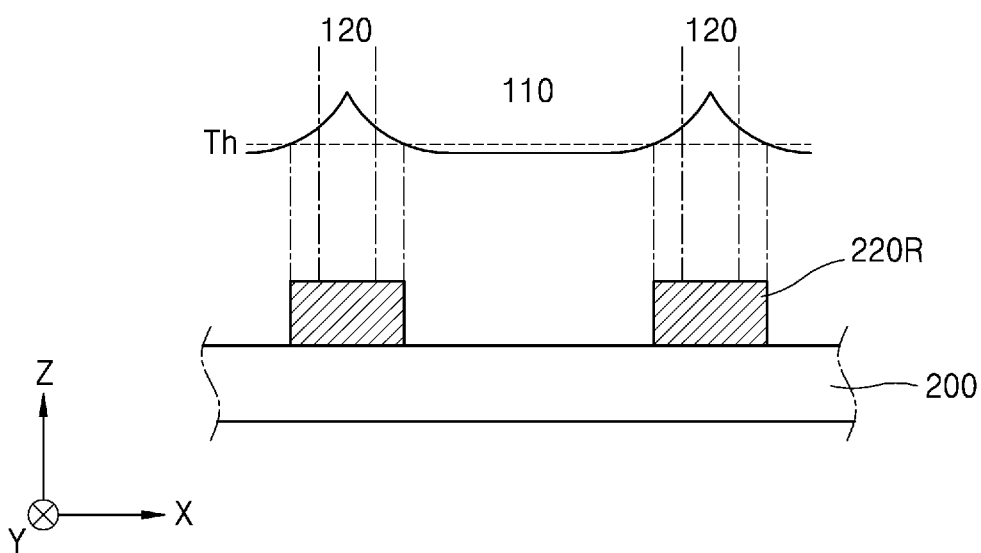
FIG. 5 is a conceptual diagram conceptually illustrating the amount of light irradiated to a photoresist when an overlapping exposure is performed.

FIG. 5 is a conceptual diagram conceptually illustrating the amount of light irradiated to a photoresist when an overlapping exposure is performed.

Referring to FIG. 5, a photoresist pattern 220R that has a width greater than the intended width of the second zone 120 is obtained by irradiating light that exceeds the threshold light amount Th to an adjacent area outside the second zone 120.

In a comparative example that is different from the present inventive concept, because the design of the second zone 120 also affects the first zone 110, it may be desirable to restart the first zone 110 from the design stage. In detail, because EUV light used to form the second zone 120 is excessively expanded, such an effect must be considered.

For example, it may be desirable to repeatedly perform the operations of designing and verifying the first zone 110 for generating the cell region on the semiconductor substrate 200 by a method such as trial and error or computer simulation. Accordingly, a long period of time and additional cost may be required to manufacture an EUV mask for product production.

In addition, when an optical proximity correction (OPC) method (see S10 in FIG. 9) of the EUV mask according to the embodiment of the present inventive concept is used, because the first zone 110 and the second zone 120 may be designed separately, the first zone 110 may be easily designed and applied immediately, and a photoresist pattern 220R having a desired width may be obtained by modifying only the design of the second zone 120.

Figure 6:
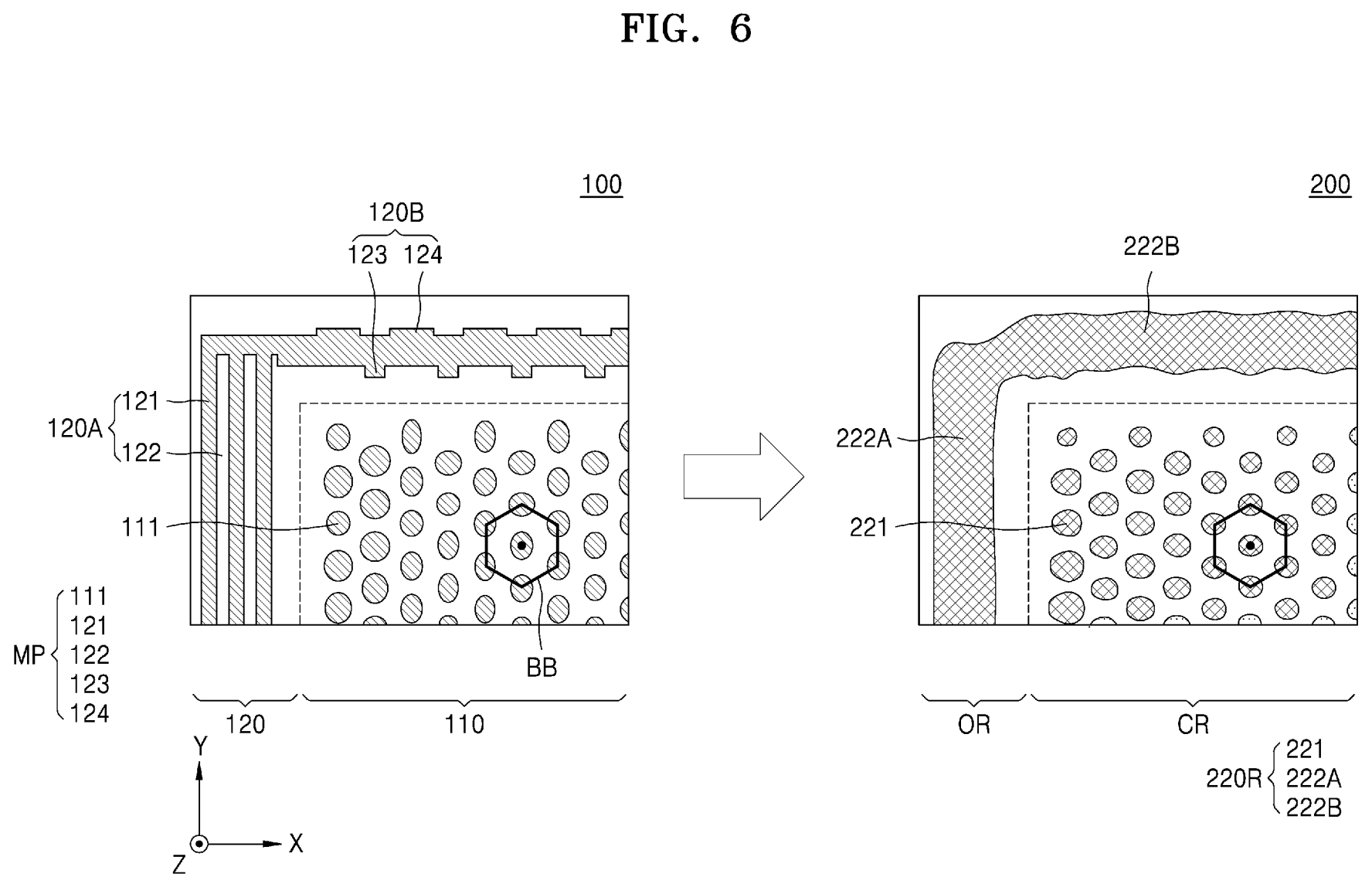
Figure 7:
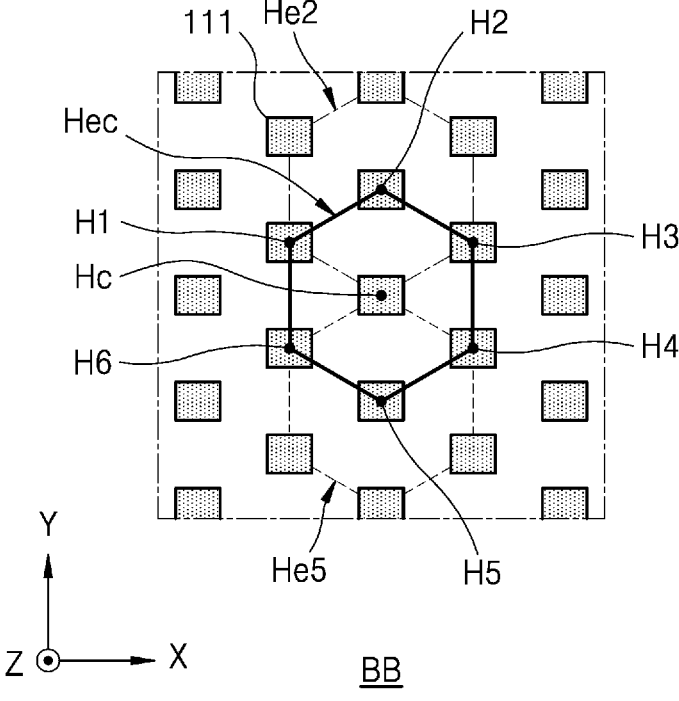
FIG. 7 is a view in which portion BB of FIG. 6 is enlarged for illustrating the arrangement of a honeycomb structure of a main pattern.

FIG. 6 is a plan view illustrating a portion of a mask pattern and a portion of a photoresist pattern corresponding thereto according to an exemplary embodiment of the present inventive concept, and FIG. 7 is a view in which portion BB of FIG. 6 is enlarged for illustrating the arrangement of a honeycomb structure of a main pattern.

Referring FIGS. 6 and 7 together, a state in which the image corresponding to a mask pattern MP of an EUV mask 100 is transferred to a photoresist pattern 220R on a semiconductor substrate 200 is shown.

The mask pattern MP may be arranged on the EUV mask 100. For example, the EUV mask 100 may have a plurality of main patterns 111 arranged in a honeycomb structure along the X and Y directions. In addition, in the EUV mask 100, a first lane 120A may have line-and-space patterns 121 and 122, and a second lane 120B may be a line pattern having first and second protruding patterns 123 and 124.

A photoresist pattern 220R having a shape similar to that of the mask pattern MP that is arranged on the EUV mask 100 may be formed on the corresponding semiconductor substrate 200. However, due to the characteristics of an EUV exposure process, the mask pattern MP might not be formed to be substantially the same as the photoresist pattern 220R.

Schematically, a plurality of circle patterns 221 similar to the plurality of main patterns 111 may be formed in a cell region CR of the semiconductor substrate 200 corresponding to a first zone 110 of the EUV mask 100. For example, the circle patterns 221 may arranged in the Y-direction and the X-direction and may arranged with a predetermined interval. In addition, in an outer region OR of the semiconductor substrate 200 corresponding to a second zone 120 of the EUV mask 100, edges 222A and 222B of a dam pattern similar to those of the first and second lanes 120A and 120B may be formed.

As described above, to prevent the phenomenon in which the width of the edge 222A extending in the Y direction of the dam pattern becomes excessively wider than the intended width during the process of four overlapping exposures, the first lane 120A may be formed as line-and-space patterns 121 and 122. As such, as a result of designing the mask pattern MP of the EUV mask 100 and verifying it using the EUV mask OPC method (see S10 in FIG. 9) according to the embodiment of the present inventive concept, the edges 222A and 222B of the dam pattern may be formed to have an intended width.

The plurality of main patterns 111 of the EUV mask 100 and the plurality of circle patterns 221 of the semiconductor substrate 200 corresponding to the plurality of main patterns 111 according to exemplary embodiment of the present inventive concept may be respectively arranged in a honeycomb structure. Here, for convenience of description, only the honeycomb structure of the plurality of main patterns 111 is described.

The honeycomb structure may have a structure in which the plurality of main patterns 111 are arranged at hexagonal vertices H1, H2, H3, H4, H5 and H6 and a center point Hc. As shown, the plurality of main patterns 111 may be arranged in a structure in which the honeycomb structure is partially overlapped by other honeycomb arrangements or structures, which are formed by the arrangement of the plurality of main patterns 111, in the X and Y directions.

For example, each of the six vertices H1, H2, H3, H4, H5, and H6 of the central hexagon Hec (shown by the solid line) may be the respective center point of the six hexagons arranged adjacent to the central hexagon Hec, and the center point He of the central hexagon Hec has a structure shared by six hexagons, and a plurality of main patterns 111 may be arranged in the six hexagons.

For example, the second vertex H2 may become the center point of the second hexagon He2 (shown by the dashed-dotted line). Further, the fifth vertex H5 may become the center point of the fifth hexagon He5 (shown by the dashed line), and the center point He of the central hexagon Hec may be shared with each other as one of six vertices of the second hexagon He2 and the fifth hexagon He5.

In the honeycomb structure of the plurality of main patterns 111, the hexagon may be, for example, a regular hexagon. In addition, all six triangles sharing the center point Hc may be equilateral triangles. Accordingly, within a hexagon, neighboring vertices may be equally spaced apart, or the distances between the vertices and a center point may all be equal.

As described above, because the plurality of main patterns 111 are arranged in a honeycomb structure, when the plurality of main patterns 111 are maintained at regular or predetermined intervals from each other and the plurality of main patterns 111 are implemented as a plurality of circle patterns 221 on the semiconductor substrate 200, the plurality of circle patterns 221 may be formed to have substantially the same structure as the plurality of main patterns 111.

Figure 8:
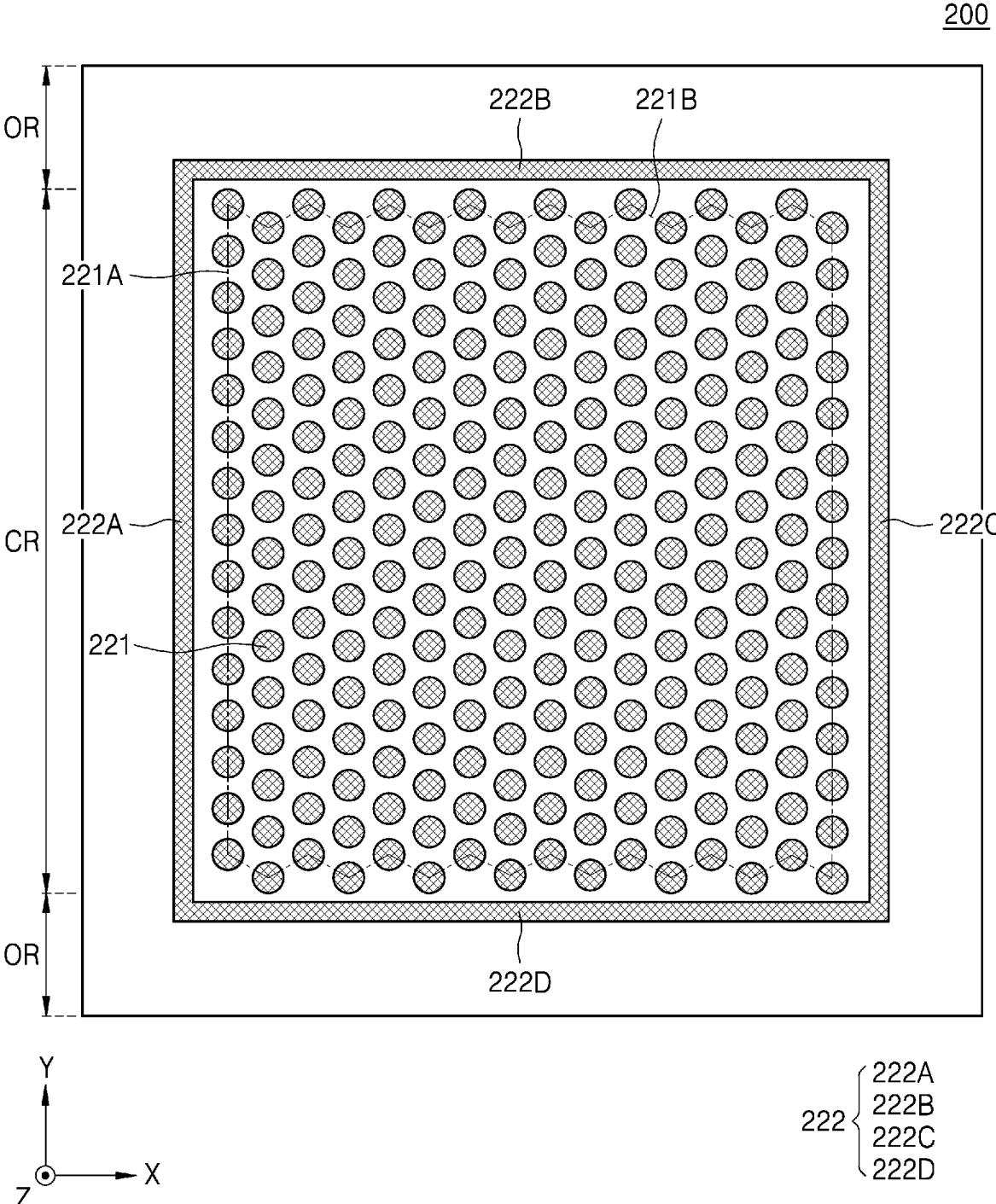
FIG. 8 is a plan view illustrating a photoresist pattern to illustrate a method of forming a pattern of a semiconductor device according to an exemplary embodiment of the present inventive concept.

FIG. 8 is a plan view illustrating a photoresist pattern to illustrate a method of forming a pattern of a semiconductor device according to an exemplary embodiment of the present inventive concept.

Referring to FIG. 8, a photoresist pattern 220R having a closed square dam pattern 222 is illustrated. The closed square dam pattern 222 having a plurality of circle patterns 221 and four edges 222A, 222B, 222C, and 222D arranged along the X and Y directions on a semiconductor substrate 200. It is to be understood that a manufactured photoresist pattern 220R might not appear as in FIG. 8.

A cell region CR and an outer region OR surrounding the cell region CR may be provided in the semiconductor substrate 200. A plurality of transistors and a plurality of capacitors may be formed in the cell region CR.

In the cell region CR, a plurality of circle patterns 221 may be arranged in a honeycomb structure. In the outer region OR, the closed square dam pattern 222 may surround the plurality of circle patterns 221. Here, the plurality of circle patterns 221, which are adjacent to the two edges 222A and 222C of the dam pattern 222 that face each other and that extend in the Y direction, may be arranged in a straight line to form line 221A. In addition, the plurality of circle patterns 221, which are adjacent to the two edges 222B and 222D of the dam pattern 222 that face each other and that extend in the X direction, may be arranged in a zigzag line to form line 221B. For example, the plurality of circle patterns 221, which are adjacent to the two edges 222B and 222D of the dam pattern 222, may be alternately arranged along the X-direction.

To form the plurality of circle patterns 221 and the dam pattern 222, a photolithography process using the EUV mask 100 (refer to FIG. 6) according to an exemplary embodiment of the present inventive concept may be performed. As described above, the mask pattern MP (refer to FIG. 6) formed on the EUV mask 100 (refer to FIG. 6) may correspond to the plurality of circle patterns 221 and the dam pattern 222 on the semiconductor substrate 200.

Figure 9:
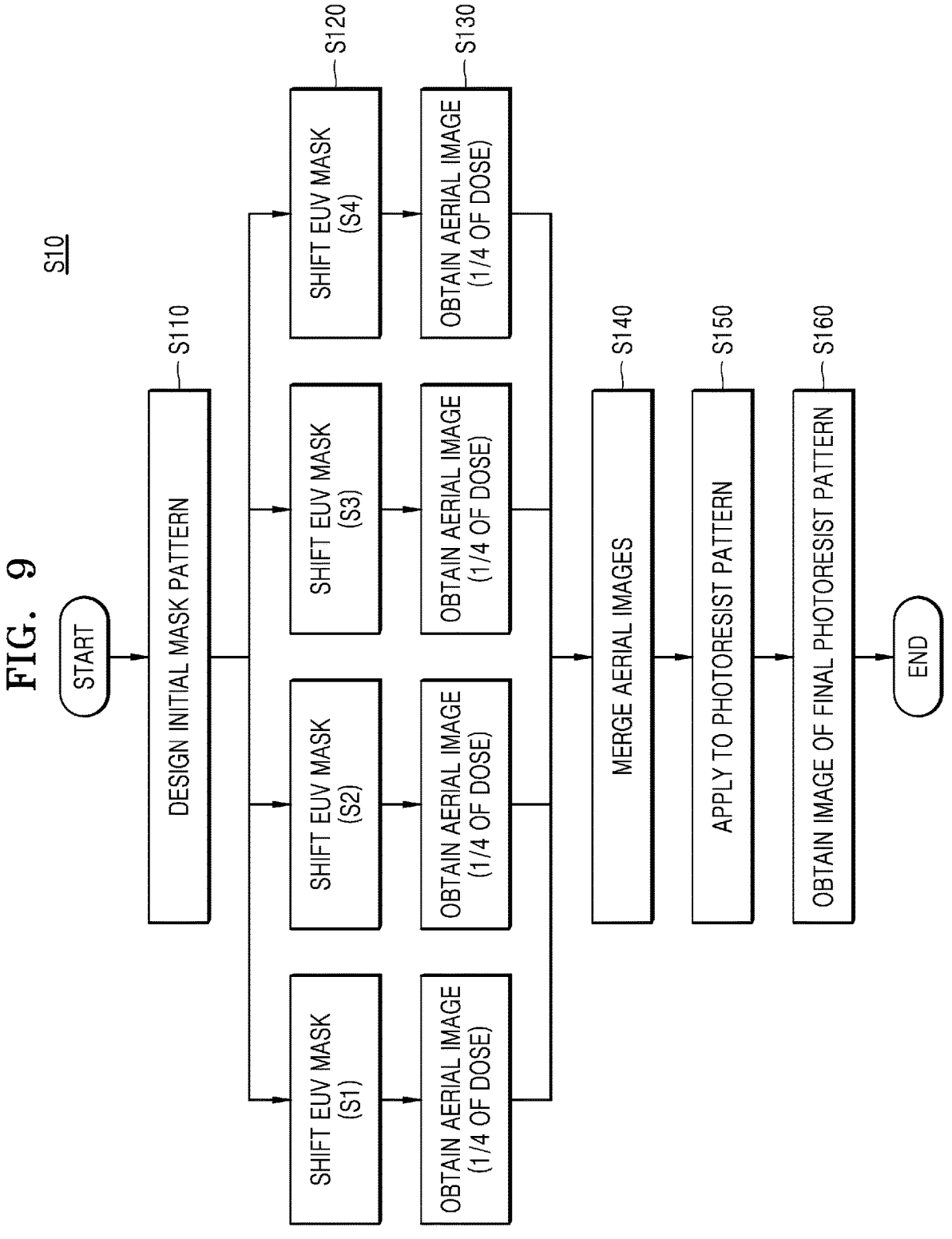
FIG. 9 is a flowchart schematically illustrating a process of an optical proximity correction (OPC) method of an EUV mask according to an exemplary embodiment of the present inventive concept.

FIG. 9 is a flowchart schematically illustrating a process of an OPC method of an EUV mask according to an exemplary embodiment of the present inventive concept.

Referring to FIG. 9, the OPC method S1o of an EUV mask may include the process order of first to sixth operations S110 to S160.

Where a certain embodiment may be implemented otherwise, a certain process may be performed in a different order from the described order. For example, two processes described in succession may be performed substantially simultaneously, or may be performed in a reverse order when compared to the described order.

An OPC method S10 of an EUV mask according to an exemplary embodiment of the present inventive concept may include a first operation S110 of designing an initial mask pattern on an EUV mask. In addition, the OPC method S10 may include a second operation S120 of performing four overlapping exposures by shifting the EUV mask in different directions, and a third operation S130 of obtaining an aerial image in each exposure. The OPC method S10 may further include a fourth operation S140 of merging the obtained aerial images, and a fifth operation S150 of applying the merged image to a photoresist pattern. The OPC method may additionally include a sixth operation S160 of obtaining an image of the final photoresist pattern.

In the EUV mask OPC method S10 according to an exemplary embodiment of the present inventive concept, the first to sixth operations S110 to S160 are performed in a first zone 110 (refer to FIG. 2) and the second zone 120 (refer to FIG. 2), respectively, of the EUV mask 100. In other words, the OPC method S10 of the EUV mask 100 may include a first OPC method (substantially the same as S10), of forming a plurality of main patterns 111 (refer to FIG. 2), and a second OPC method (substantially the same as S10) of forming first to fourth lanes 120A, 120B, 120C, and 120D, and the first OPC method and the second OPC method are performed separately from each other.

The technical features of each of the first to sixth operations S110 to S160 have been described with reference to the above-described EUV mask 100 (refer to FIG. 4) and the semiconductor substrate 200 (refer to FIG. 4), so detailed descriptions of the EUV mask 100 and the semiconductor substrate 200 are omitted here to prevent redundant discussions.

Figure 10:
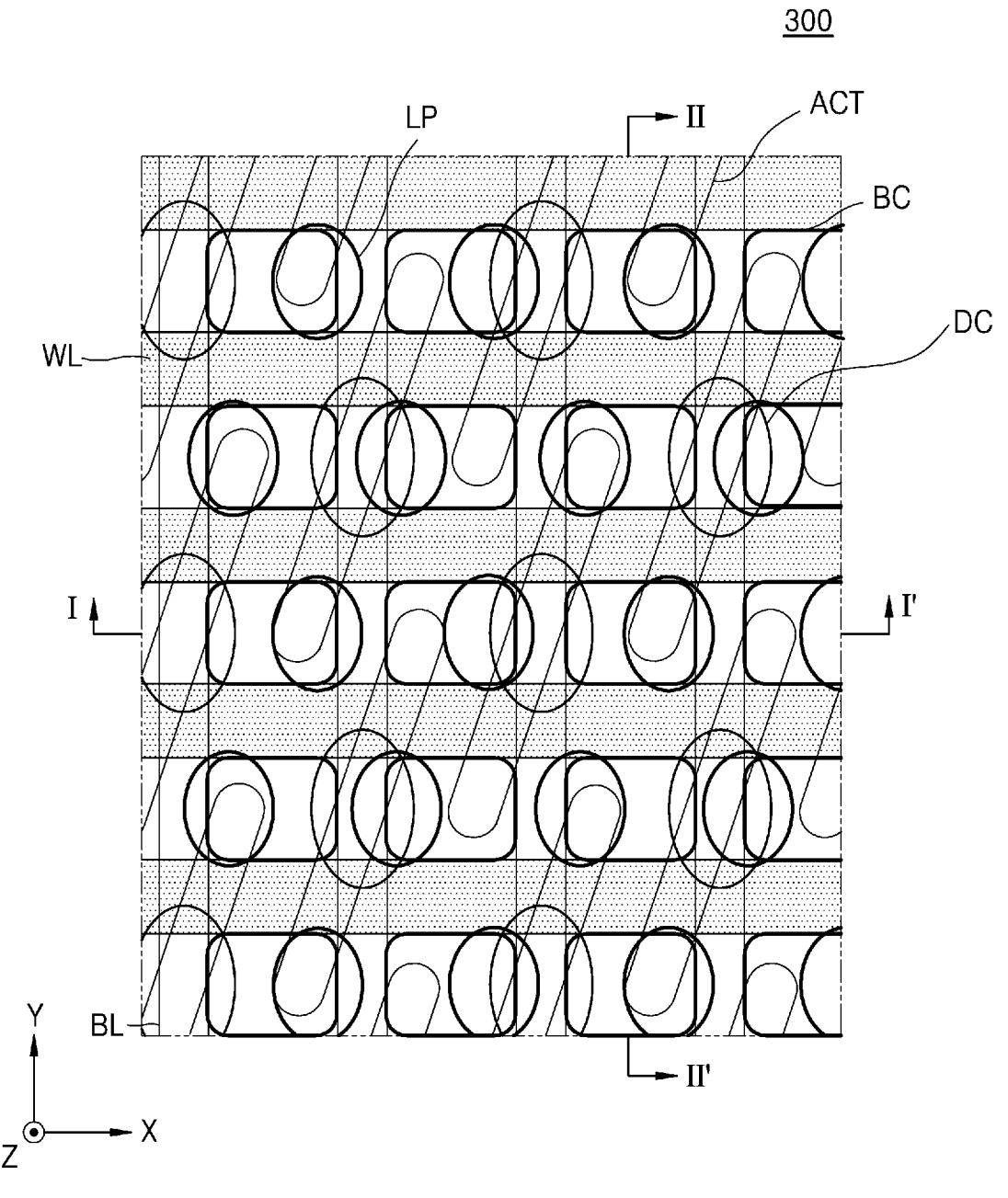
FIG. 10 is a schematic layout of a semiconductor device manufactured by a method of forming a pattern of a semiconductor device according to an exemplary embodiment of the present inventive concept.

FIG. 10 is a schematic layout of a semiconductor device manufactured by a method of forming a pattern of a semiconductor device according to an exemplary embodiment of the present inventive concept.

Referring to FIG. 10, a semiconductor device 300 may include a plurality of active regions ACT in a bar shape of a diagonal line or an oblique line. For example, the plurality of active regions ACT may have a rectangular shape with two rounded sides, a circular shape, or a stadium shape.

A plurality of word lines WL extending parallel to each other in an X direction across the active regions ACT may be arranged on the active regions ACT. The word lines WL may be arranged at equal intervals. A plurality of bit lines BL extending in parallel to each other in a Y direction orthogonal to the word lines WL may be arranged on the word lines WL. The bit lines BL may also be arranged at equal intervals.

In addition, the semiconductor device 300 according to an exemplary embodiment of the present inventive concept may include various contact arrangements formed on the active region ACT, for example, a direct contact DC, a buried contact BC, and a landing pad LP. Here, the direct contact DC may refer to a contact connecting the active area ACT to the bit line BL, and the buried contact BC may refer to a contact connecting the active region ACT to a lower electrode of the capacitor.

In addition, due to a general arrangement structure, a contact area between the buried contact BC and the active region ACT may be very small, relatively. Accordingly, the conductive landing pad LP may be introduced to increase the contact area with the lower electrode of the capacitor as well as increase the contact area with the active region ACT. The landing pad LP may be arranged between the active region ACT and the buried contact BC, or between the buried contact BC and the lower electrode of the capacitor.

In the semiconductor device 300 of the present embodiment, the direct contact DC may be arranged in a central portion of the active region ACT, and the buried contact BC may be disposed at both ends of the active area ACT. As the buried contact BC is arranged at both ends of the active area ACT, the landing pad LP may be arranged adjacent to both ends of the active area ACT to partially overlap the buried contact BC.

In addition, the word line WL is formed in a structure buried in the semiconductor substrate of the semiconductor device 300, and may be arranged across the active area ACT between the direct contact DC and the buried contact BC. As shown, the two word lines WL may be arranged to cross one active area ACT, and the active area ACT is arranged in an oblique shape to have a predetermined angle less than about 90° with respect to the word line WL.

The direct contact DC may be symmetrically arranged with the buried contact BC, and accordingly, the direct contact DC and the buried contact BC may be arranged on a straight line along the X-axis and Y-axis. In addition, the landing pad LP may be arranged in a zigzag form (e.g., an alternating arrangement) in the X direction in which the word line WL extends, unlike the direct contact DC. In addition, in the X direction in which the word line WL extends, the word line WL may be arranged to overlap the same side portion of each bit line BL. For example, each of the landing pads LP of the first line may overlap the left side of the corresponding bit line BL, and each of the landing pads LP of the second line may overlap the right side of the corresponding bit line BL.

The semiconductor device 300 according to the present embodiment has an effect of increasing productivity and efficiency by forming a fine photoresist pattern of an accurate form on a semiconductor substrate using an EUV mask that may be designed accurately and has fewer defects during an exposure process of an open region for forming landing pad LP.

Figure 11A:
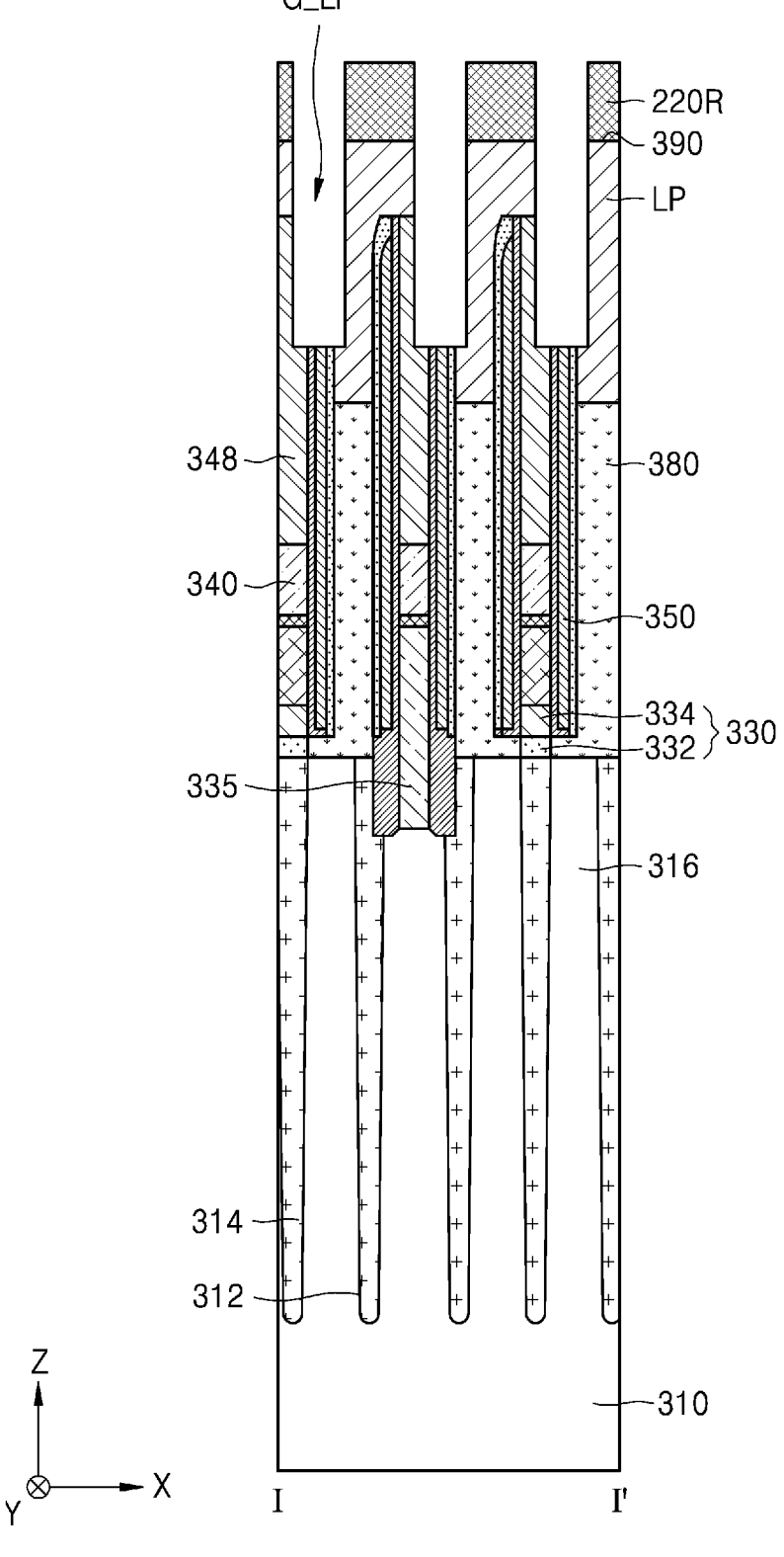
FIGS. 11A and 11B are cross-sectional views taken along lines I-I' and II-II' of FIG. 10.
Figure 11B:
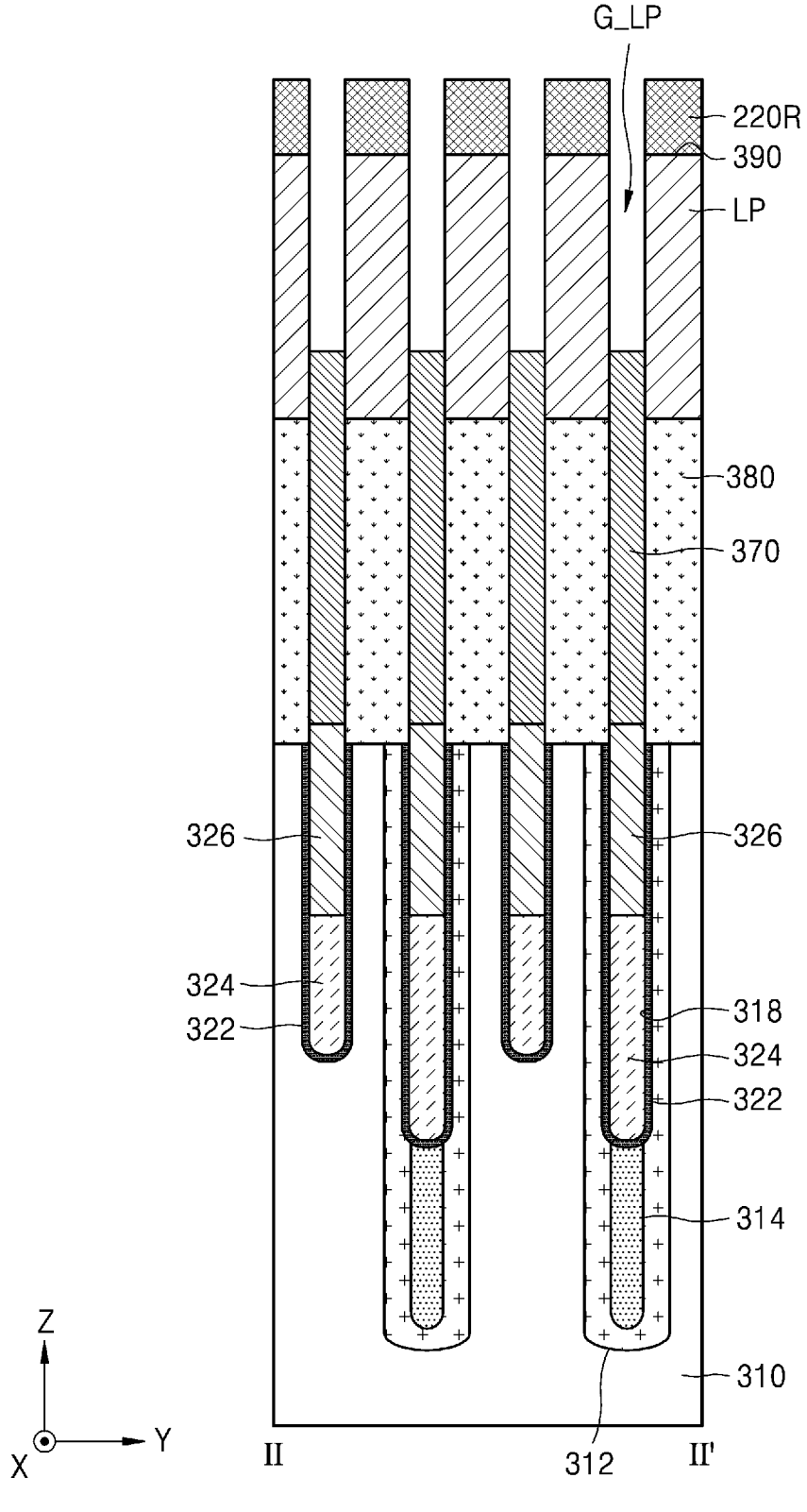

FIGS. 11A and 11B are cross-sectional views taken along lines I-I' and I-II' of FIG. 10.

Referring to FIGS. 11A and 11B together, 11A and 11B together, the shape of a semiconductor device 300 in which a landing pad LP that is connected to a buried contact 380 is formed using a photoresist pattern 220R as an etch mask is illustrated.

First, a process of forming the semiconductor device 300 is briefly described as follows. A device isolation trench 312 is formed in a semiconductor substrate 310, and a device isolation layer 314 is formed in the device isolation trench 312. An active region 316 may be defined in the semiconductor substrate 310 by the device isolation layer 314. A word line trench 318 in which a step is formed is formed on the bottom surface, and a gate dielectric film 322, a word line 324, and a buried insulating film 326 are sequentially formed in the word line trench 318. A bit line structure 340 is formed on an interlayer insulating layer pattern 330 and a direct contact 335. A multilayer spacer 350 is formed on both sidewalls of the bit line structure 340. For example, a first insulating layer 370 is formed to cover upper surfaces of the bit line structure 340 and the multilayer spacer 350. In addition, the first insulating layer 370 may be formed on the buried insulating film 326. A plurality of buried contacts 380 are formed to expose top surfaces of the bit line structure 340 and the multilayer spacer 350. A metal layer 390 covering upper surfaces of the bit line structure 340 and the multilayer spacer 350 is formed.

Thereafter, after forming a photoresist pattern 220R on the metal layer 390, using the photoresist pattern 220R as an etch mask, the metal layer 390, the underlying bit line structure 340 and a portion of the multilayer spacer 350 are etched to form a plurality of landing pads LP respectively connected to the buried contact 380.

The photoresist pattern 220R may have a shape of a circle separated from each other similarly to the landing pad LP. Accordingly, during the process of forming the landing pad LP using the photoresist pattern 220R as an etch mask, as shown, a groove G_LP for the landing pad is formed. Each landing pad LP may be separated from each other by the landing pad groove G_LP, and may be electrically insulated from each other. In addition, a top surface of the multilayer spacer 350 may be exposed through the landing pad groove G_LP. In an exemplary embodiment of the present inventive concept, a side surface of the bit line structure 340 may be exposed through the landing pad groove G_LP.

For example, during the process of forming the groove G_LP for the landing pad, the upper part of the insulating capping line 348 of the bit line structure 340 and the upper part of the multi-layer spacer 350 formed on the sidewall of the insulating capping line 348 may be removed, and accordingly, the side surface of the insulating capping line 348 and the upper surface of the multilayer spacer 350 may be exposed through the landing pad groove G_LP.

In this way, after the landing pad LP is formed, the photoresist pattern 220R may be removed by ashing and stripping processes.

While the present inventive concept has been described with reference to embodiments thereof, it will be understood by those of ordinary skill in the art that various changes in form and details may be made thereto without departing from the spirit and scope of the present inventive concept.

What is claimed is:

1. A method of forming a pattern of a semiconductor device, the method comprising:
   preparing a semiconductor substrate on which a cell region and an outer region surrounding the cell region are provided;
   applying a photoresist on the semiconductor substrate;
   irradiating extreme ultraviolet (EUV) light reflected from an EUV mask, onto the photoresist;
   forming a photoresist pattern in the cell region and the outer region by developing the photoresist; and
   etching the semiconductor substrate, using the photoresist pattern as an etch mask,
   wherein the EUV mask comprises:
   a plurality of main patterns arranged in a first zone, of the EUV mask, corresponding to the cell region, in a first direction and in a second direction substantially perpendicular to the first direction; and
   a first lane and a second lane in a second zone, of the EUV mask, corresponding to the outer region, wherein the first lane and the second lane surround the plurality of main patterns, wherein the first lane extends in the first direction and has a line-and-space pattern, and the second lane extends in the second direction and has a protruding pattern.

2. The method of claim 1, wherein the plurality of main patterns are arranged in a honeycomb structure,
   wherein first main patterns of the plurality of main patterns, which are located at vertices of a hexagon, and a second main pattern of the plurality of main patterns, which is located at a center point of the hexagon, form a first hexagonal structure,
   wherein the first main patterns located at vertices of the first hexagonal structure become second main patterns, of the plurality of main patterns, located at center points of second through seventh hexagonal structures, respectively, wherein the first through seventh hexagonal structure are different from each other, and
   wherein the second main pattern located at the center point of the second hexagonal structure is shared with the third hexagonal structure as a first main pattern, of the plurality of main patterns, located at a vertex of the third hexagonal structure.

3. The method of claim 1, wherein a plurality of circle-shaped photoresist patterns are formed in the cell region of the semiconductor substrate corresponding to the plurality of main patterns of the EUV mask.

4. The method of claim 1, wherein a closed square dam-shaped photoresist pattern is formed in the outer region of the semiconductor substrate corresponding to the first and second lanes of the EUV mask.

5. The method of claim 4, wherein the plurality of main patterns adjacent to the first lane are arranged in the first direction.

6. The method of claim 4, wherein the plurality of main patterns adjacent to the second lane are arranged in an alternating arrangement in the second direction.

7. The method of claim 1, wherein, when the EUV light reflected from the EUV mask overlaps the photoresist formed on the semiconductor substrate and irradiates the photoresist N times (where N is an integer of 2 or more), an amount of the EUV light exceeds a threshold light amount in the photoresist corresponding to the first and second lanes.

8. The method of claim 7, wherein, by shifting the EUV mask in different directions from a center point of the semiconductor substrate, the photoresist is overlapped and irradiated N times with a dose amount of EUV light of 1/N of a dose amount corresponding to the threshold light amount.

9. The method of claim 1, wherein the line-and-space pattern of the first lane includes at least two line patterns.

10. The method of claim 1, wherein the protruding pattern of the second lane includes first protrusions and second protrusions, wherein the first protrusions extend toward the plurality of main patterns, and the second protrusions extend away from the plurality of main patterns.

11. A method of forming a pattern of a semiconductor device, the method comprising:

shifting an extreme ultraviolet (EUV) mask in different directions from a center point of a semiconductor substrate, and overlapping and irradiating EUV light reflected from the EUV mask, onto a photoresist on the semiconductor substrate; and developing the photoresist to form a photoresist pattern having a plurality of circle patterns and a closed square dam pattern, wherein the circle patterns are arranged in a honeycomb structure, and wherein the closed square dam pattern surrounds the plurality of circle patterns, wherein a mask pattern, of the EUV mask, corresponding to the dam pattern comprises:

a first lane extending in a first direction and having a line-and-space pattern; and a second lane extending in a second direction substantially perpendicular to the first direction and having a protruding pattern.

12. The method of claim 11, wherein, when centers of outermost circle patterns among the plurality of circle patterns are connected to each other by an imaginary line, wherein four boundary lines are formed, and among the four boundary lines, two boundary lines that extend in the first direction and that face each other are straight lines, and two boundary lines that extend in the second direction and that face each other are zigzag lines.

13. The method of claim 12, wherein the two boundary lines that are straight lines face a first sidewall of the dam pattern, wherein the first sidewall extends in the first direction, and the boundary lines that are zigzag lines face a second sidewall of the dam pattern, wherein the second sidewall extends in the second direction.

14. The method of claim 12, wherein the line-and-space pattern of the first lane corresponds to the boundary lines that are straight lines, and the protruding pattern of the second lane corresponds to the boundary lines that are zigzag lines.

15. The method of claim 14, wherein the line-and-space pattern of the first lane includes three line patterns and two space patterns alternately arranged.

16. A method of forming a pattern of a semiconductor device, the method comprising: overlapping and irradiating EUV light reflected from an EUV mask, onto a photoresist, wherein the EUV mask includes a plurality of main patterns, a first lane, and a second lane, wherein the plurality of main patterns arranged in a honeycomb shape, wherein the first lane surrounds the plurality of main patterns, extends in a first direction, and has a plurality of lines, and wherein the second lane extends in a second direction substantially perpendicular to the first direction and has a protruding pattern.

17. The method of claim 16, wherein the plurality of lines of the first lane include line-and-space patterns, and the protruding pattern of the second lane includes first protrusions and second protrusions, wherein the first protrusions extend toward the plurality of main patterns, and the second protrusions extend away from the plurality of main patterns.

18. The method of claim 17, wherein the first and second lanes form a closed square shape surrounding the plurality of main patterns.

19. The method of claim 16, wherein the shapes of the plurality of main patterns, the first lane, and the second lane are respectively generated using an optical proximity correction (OPC) method.

20. The method of claim 19, wherein the OPC method includes:

a first OPC method of forming the plurality of main patterns; and a second OPC method of forming the first and second lanes, wherein the first OPC method and the second OPC method are performed separately from each other.

* * * * *